United States Patent [19]

Mousseau

[11] Patent Number: 4,720,448

[45] Date of Patent: Jan. 19, 1988

[54] METHOD OF MANUFACTURING PHOTORELIEF PRINTING PLATE USING A LIQUID PHOTOPOLYMER

[75] Inventor: Carlton R. Mousseau, Sylvania, Ohio

[73] Assignee: Owens-Illinois Plastic Products Inc., Toldeo, Ohio

[21] Appl. No.: 646,881

[22] Filed: Sep. 4, 1984

[51] Int. Cl.⁴ ............................................... G03C 7/02
[52] U.S. Cl. ..................................... 430/306; 430/300; 430/301; 430/394; 430/494
[58] Field of Search ............... 430/306, 394, 494, 300, 430/301

[56] References Cited

U.S. PATENT DOCUMENTS 3,156,563 11/1964 Harrison et al. ..................... 430/323
3,937,579 2/1976 Schmidt ............................... 356/172
4,193,798 3/1980 Sano et al. ........................... 430/306
4,311,785 1/1982 Ahne et al. .......................... 430/306

OTHER PUBLICATIONS

Merigraph, Hercules Corporation Bulletin MS-104 B, pp. 1-5, date unknown.

Primary Examiner—Jack P. Brammer
Attorney, Agent, or Firm—H. G. Bruss

[57] ABSTRACT

In the process of making relief printing plates a liquid photopolymerizably layer having substantially identical negatives on each of its two sides and being in registration and also having a transparent substrate is exposed to an external light source so that both sides are exposed to the same image and after removal of the negatives the unexposed areas of the plate are removed.

4 Claims, 3 Drawing Figures

METHOD OF MANUFACTURING PHOTORELIEF PRINTING PLATE USING A LIQUID PHOTOPOLYMER

BACKGROUND OF THE INVENTION

This invention relates to improvements in the method of manufacturing photorelief printing plates involving the use of a liquid photopolymer, and to a printing plate manufactured by such improved method. More particularly, this invention relates to a method of manufacturing photorelief printing plates which utilizes registered printing negatives on opposite sides of the photopolymer liquid during the curing of selected portions of the liquid by the exposure of the liquid to an ultraviolet light source which transmits light to the liquid through the non-darkened portions of the negatives, and to a printing plate manufactured by such method. Even more particularly, the invention relates to the manufacture of photorelief printing plates for the flexographic printing process by such a method and to a flexographic printing plate manufactured by such method.

The manufacture of photorelief printing plates by a technique utilizing a liquid photopolymer is known in the prior art, and equipment and supplies for the practice of this technique are commercially available from the Graphic Systems Business Center of Hercules Incorporated in Wilmington, Del. This vendor offers a variety of different Merigraph® photopolymers for use in this process, with various photopolymers being recommended for use with different types of printing inks. In the system as offered by Hercules, exposure equipment is provided in which a printing negative is placed on a glass screen, a layer of a liquid photopolymer is placed on top of the printing negative, usually with a thin film of a strippable transparent film such as a polypropylene film placed therebetween, a transparent substrate film which will be bonded to the photopolymer by the curing thereof, such as a Mylar polyester film, is placed on the top of the liquid, and the resulting composite structure exposed to an ultraviolet source of light on the other side of the glass screen and to another source of ultraviolet light on the other side of the transparent substrate. This exposure to ultraviolet light will cure the portions of the photopolymer liquid which are not shielded by the darkened portions of the negative on the lightstruck portion of the negative surface and for a finite portion of the depth of the entire substrate surface, and at the same time this will bond the portion of the cured liquid photopolymer which contacts the polyester to such substrate. While this curing is taking place, the portion of the liquid photopolymer which is adjacent to the printing negative and which is non-lightstruck because it is shaded by the darkened portions of the negative will remain in a liquid form for a portion of the depth of the liquid, and upon the removal of the partially manufactured plate from this exposure equipment this uncured liquid is removed to be discarded or recycled, and the removal of this liquid provides the relief in the print surface of the printing plate which is needed for proper printing.

SUMMARY OF THE INVENTION

In accordance with the present invention there is provided an improvement to a method as heretofore described, and in such improvement a second printing negative which is substantially identical to the first printing negative is utilized during the curing process in substantial registration with the first printing negative, the second printing negative being in contact with the side of the substrate layer which is opposite that which contacts the photopolymer. This second printing negative, because of its darkened portions, serves to impede the curing of the photopolymer liquid which contacts the polyester substrate in the non-lightstruck portions thereof, thereby providing for more relief in the print surface of the printing plate produced by such improved method and making it possible to recycle a greater portion of the liquid photopolymer for use in the manufacture of other printing plates. Such recycling permits an overall reduction in the amount of fresh liquid used in the manufacture of such printing plates by the repeated application of the method. Additionally, the method of the present invention also permits the manufacture of thinner printing plates by permitting longer periods of light exposure of the substrate side of the photopolymer layer, to insure proper bonding of the photopolymer to the substrate, without detracting from the depth of relief in the print surface which can occur when exposure times are long.

The method of the present invention is directed primarily to the manufacture of printing plates for use in the flexographic printing process, a process in which the plates are wrapped around and attached to a printing cylinder. This process is widely used, for example, to print labels for glass and plastic beverage bottles on various types of thermoplastic label materials.

Accordingly, it is an object of the present invention to provide an improved method of manufacturing a photorelief printing plate involving the use of a liquid photopolymer, and it is a corresponding object to provide an improved printing plate manufactured by such method. More particularly, it is an object of the present invention to provide an improved method of manufacturing a photorelief printing plate involving the use of a liquid photopolymer, in which the improvement involves the use of a pair of identical negatives in registration with one another on opposite sides of the photopolymer during the selective curing thereof, and it is a corresponding object to provide an improved printing plate manufactured by such method. It is also an objective of the present invention to provide a method of manufacturing a photorelief printing plate involving a liquid photopolymer in which liquid photopolymer is removed from the manufacturing process in larger quantities and in a purer form to permit the removed liquid to be recycled, and it is a corresponding object of the invention to provide a printing plate manufactured by such method. It is also an object of the present invention to provide a method of manufacturing a photorelief printing plate involving a liquid photopolymer, which method can be used to manufacture plates which are thinner than those which can be manufactured by prior art methods without detracting from the quality of the bond between the cured photopolymer and the substrate which is a part of the plate and without detracting from the quality of the relief in the printing surface of the plate.

For a further understanding of the present invention and the objects thereof, attention is directed to the drawing and the description thereof, to the detailed description of the invention and to the appended claims.

DETAILED DESCRIPTION OF THE INVENTION

Figure 1:
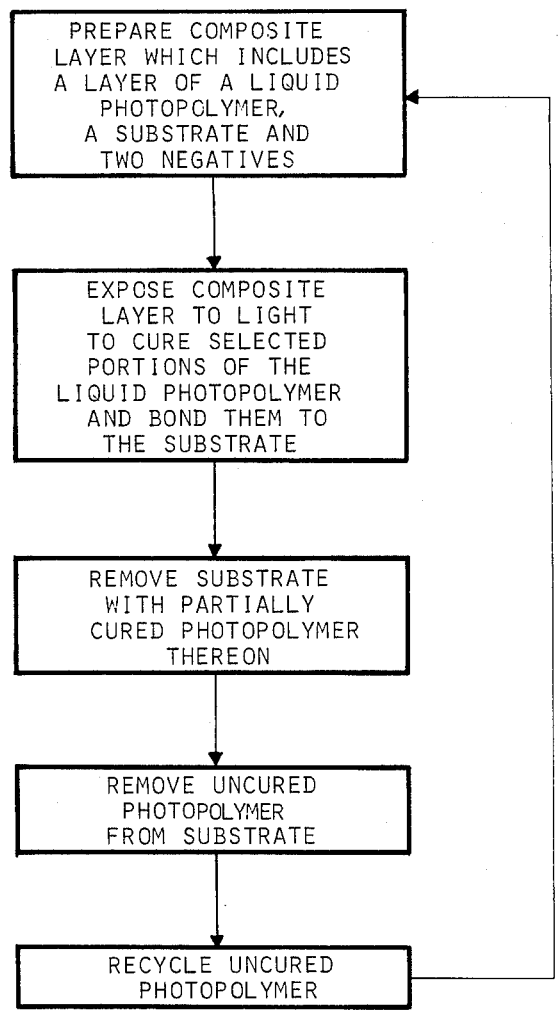
FIG. 1 is a diagrammatic illustration of various steps in the method of the present invention.
Figure 2:
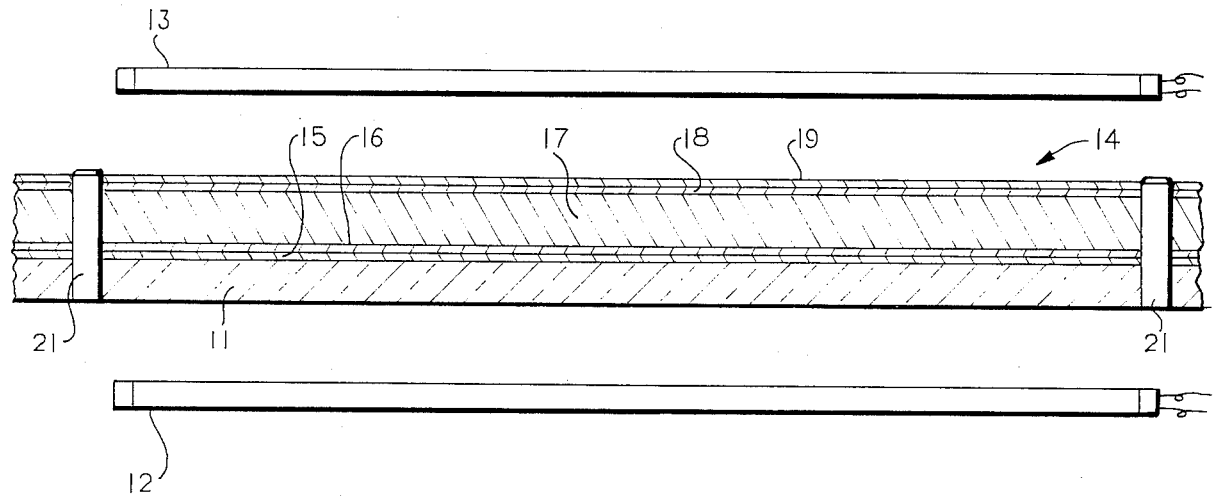
FIG. 2 is a schematic drawing of one of the steps in the method of FIG. 1.

As is illustrated in FIG. 2, the invention utilizes otherwise conventional equipment for the manufacture of photorelief printing plates from liquid photopolymeric materials, such as a Hercules Incorporated Merigraph exposure unit, and such equipment incorporates a horizontally situated transparent glass screen 11 and ultraviolet light sources 12 and 13 below and above the screen, respectively. In the practice of the method of the invention, as is illustrated in the first or top block of the diagram in FIG. 1, and in FIG. 2, a composite layer, generally indicated by numeral 14 in FIG. 2, is formed on glass screen 11. Thereafter, as is indicated in the second block from the top in FIG. 1, light sources 12 and 13 are actuated to cure selected portions of a material, as hereinafter described, which is contained in the composite layer.

The first or lowermost layer 15 of composite layer 14 comprises a photographic negative of the pattern which is to be applied to the printing plate being manufactured, and where it is desired to prepare a large printing plate for the simultaneous printing of multiple identical images, negative 16 may comprise multiple images prepared by the step and repeat process in a known manner. In any case, negative 15, which is positioned on the glass screen 11 with its emulsion side up, is then covered with a thin film 16 to separate it from direct contact with the photopolymer liquid which will be placed thereon, as hereinafter described. Film 16 is of a composition which will be readily strippable from negative 15 and from the superimposed photopolymer liquid after the curing thereof, to permit the reuse of the negative and to avoid damage to the cured surface of the photopolymer liquid in contact therewith, which will be the print surface of the finished printing plate. Polypropylene films of the order of 0.75 mils in thickness (0.00075 in.) have been found to be suitable for use as a cover film 16 in many applications.

After cover film 16 is in place over negative 15, a relatively thick (typically 60 mils and in any case at least 50 mils in thickness according to the prior art although in accordance with the present invention it is expected that lower thicknesses can be achieved without detracting from plate quality) layer of a liquid photopolymer resin 17 is deposited over cover film 16, again by apparatus which is normally a part of the exposure unit as heretofore described. Commercially available resins such as Hercules Merigraph ® resins may be utilized in the method of the present invention in accordance with the recommendations of the manufacturer of the resin for use in prior art printing plate manufacturing methods.

After layer 17 is in place, it is covered by a substrate layer 18 which is of a composition which will bond to resin layer 17 upon the photocuring of layer 17 as hereinafter described. Substrate 18 may advantageously be of polyester composition, such as DuPont's Mylar ® polyester, and it may typically be of the order of 4 mils or 7 mils (0.004 in. or 0.007 in.) in thickness.

The final layer in composite layer 14 is another photographic negative 19 which is identical to negative 15. Negative 19 is superimposed on substrate 18 as the final layer in forming composite layer 14. It is important to accurately register negatives 15 and 19 with respect to one another in the composite layer, and to effect this registration glass screen 11 is provided with registration pins 21 which are adapted to receive registration holes which are formed in photographic negatives before they are utilized in the printing plate forming equipment. As shown, the presence of registration pins 21 as part of the plate forming equipment will also inherently provide holes in the photopolymer liquid, and the presence of these holes in the plate when it comes from the plate forming equipment will eliminate the subsequent need to form registration holes in the finished plate to permit the plate to be precisely mounted on the printing cylinder on which it will be utilized. In fact, the illustrated technique is a more precise technique for forming registration holes in a printing plate than the technique of forming them after the printing plate has been formed, because they are inherently in register with the photographic negative or negatives used in the plate making method.

Figure 3:
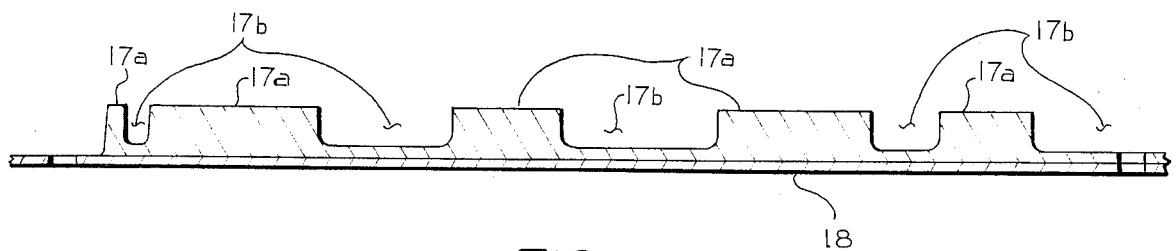
FIG. 3 is a schematic sectional drawing of a printing plate which has been prepared by the method depicted in FIGS. 1 and 2.

As heretofore described, after the composite layer 14 has been formed on glass screen 11, light sources 12 and 13 are energized for a predetermined period of time. This will cause light to pass through the non-darkened areas of negatives 15 and 19 to strike selected portions of the surfaces of photopolymer liquid 17, and thereby to cure the lightstruck portions thereof and bond such lightstruck portions to substrate 18. Substantially all of the non-lightstruck portions of photopolymer liquid 17 extending inwardly from the glass plate side thereof will remain in the liquid form, and after the end of the curing cycle the composite layer 14 is removed from the platemaking equipment, as is shown in the third block in FIG. 1. After the removal of the negatives 15 and 19 and the cover film 16 from the removed composite layer 14, the uncured photopolymer resin is removed from the cured resin on the substrate 18 to provide recesses or relief between the raised cured portions of the resin to permit the surface of the resin away from the substrate to be utilized for printing. This step is indicated in the fourth block in FIG. 1. The printing plate in the form in which it emerges from the fourth block in FIG. 1 is illustrated in FIG. 3 in an inverted position from that in which it is formed in FIG. 2, and this view shows raised cured portions 17a of the photopolymer 17 with depressed or relief portions 17b where the uncured resin was removed, all supported on substrate layer 18, with the pattern of raised portions 17a defining the image to be printed by the printing plate.

Because the non-lightstruck portions of the photopolymer liquid are shielded from contact with light on the substrate side as well as on the print side by virtue of the use of the second negative 19, as opposed to the prior technique of utilizing only a single negative, corresponding to negative 15, to shield the print side of the photopolymer liquid, it is possible to obtain deeper and sharper relief in the relief portions 17b of the printing plate. Also, the use of the second negative, corresponding to negative 19, will inhibit the partial curing of the resin which occurs when the relief areas of the printing plate are exposed to light from the reverse side during curing. Thus, in the liquid resin removal step which takes place after the removal of the printing plate from the exposure equipment, which can be accomplished by squeegeeing and/or dripping, more resin can be removed and the removed resin will be less contaminated, and each of these factors contributes to the practicability of recycling the liquid resin. In a preferred embodiment of this invention, therefore, the removed liquid resin is recycled for re-use in a subsequent plate making operation, as depicted in the fifth block in FIG. 1.

The best mode known to me to carry out this invention has been described above in terms sufficiently full, clear, concise and exact as to enable any person skilled in the art to make and use the same. It is to be understood, however, that it is within my contemplation that certain modifications of the above-described mode of practicing the invention can be made by a skilled artisan without departing from the scope of the invention and it is, therefore, desired to limit the invention only in accordance with the appended claims.

What is claimed is:

1. The method of manufacturing a photorelief printing plate comprising the steps of: preparing a composite layer comprising a layer of a liquid photopolymer, a first printing negative on one side of the liquid photopolymer, a second printing negative on the other side of the liquid photopolymer, said second printing negative being substantially identical to said first printing negative and being in registration therewith, a transparent substrate between said liquid photopolymer and one of said printing negatives and in surface to surface contact with said liquid photopolymer and said one of said printing plates, said transparent substrate being bondable to said liquid photopolymer upon the curing of said liquid photopolymer; curing selected portions of said liquid photopolymer by exposing said composite layer to light sources external to said first and second printing negatives to permit light to pass through said negatives; removing said printing negatives from said composite layer; and removing the uncured portions of said liquid photopolymer.

2. The method in accordance with claim 1 wherein the thickness of the liquid photopolymer in the composite layer is less than 50 mils.

3. The method in accordance with claim 1 and comprising the additional step of recycling at least a substantial portion of the removed uncured liquid photopolymer for use in manufacturing additional printing plates.

4. The method in accordance with claims 1 or 2 in which the composite layer includes a layer of a strippable transparent film between said liquid photopolymer and the other of said printing negatives, and in surface to surface contact with said liquid photopolymer and said other of said printing plates, and in which the removal of the other of said printing negatives from said composite layer includes the separation of said film from the selectively cured photopolymer and from the other of said printing negatives.

* * * * *